United States Patent
Wu et al.

(10) Patent No.: US 8,270,200 B2
(45) Date of Patent: Sep. 18, 2012

(54) NANOSCALE THREE-TERMINAL SWITCHING DEVICE

(75) Inventors: Wei Wu, Palo Alto, CA (US); Qiangfei Xia, Palo Alto, CA (US); Philip J. Kuekes, Menlo Park, CA (US); R. Stanley Williams, Portola Valley, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 535 days.

(21) Appl. No.: 12/512,230

(22) Filed: Jul. 30, 2009

(65) Prior Publication Data

US 2011/0024714 A1 Feb. 3, 2011

(51) Int. Cl.
*G11C 11/00* (2006.01)
(52) U.S. Cl. .................. 365/148; 365/151; 977/943
(58) Field of Classification Search .................. 365/151; 977/943
See application file for complete search history.

(56) References Cited

U.S. PATENT DOCUMENTS

| 7,443,711 | B1 * | 10/2008 | Stewart et al. ............... 365/148 |
| 7,763,880 | B2 * | 7/2010 | Williams ........................ 257/8 |
| 2010/0264397 | A1 * | 10/2010 | Xia et al. ........................ 257/4 |
| 2011/0121359 | A1 * | 5/2011 | Yang et al. .................... 257/109 |
| 2011/0176353 | A1 * | 7/2011 | Li et al. ........................ 365/148 |
| 2011/0227030 | A1 * | 9/2011 | Pickett et al. .................... 257/4 |

OTHER PUBLICATIONS

Chua, "Memristor—The Missing Circuit Element," Sep. 1971, IEEE Transactions on Circuit Theory, vol. CT-18, No. 5, pp. 507-519.*
Williams, "How We Found the Missing Memristor," Dec. 2008, IEEE Spectrum vol. 45, Iss. 12, pp. 28-35.*
Strukov et al., "The missing memristor found," May 2008, Nature 453, pp. 80-83.*

* cited by examiner

*Primary Examiner* — Alexander Sofocleous

(57) ABSTRACT

A nanoscale three-terminal switching device has a bottom electrode, a top electrode, and a side electrode, each of which may be a nanowire. The top electrode extends at an angle with respect to the bottom electrode and has an end section going over and overlapping the bottom electrode. An active region is disposed between the top electrode and bottom electrode and contains a switching material. The side electrode is disposed opposite from the top electrode and in electrical contact with the active region. A self-aligned fabrication process may be used to automatically align the formation of the top and side electrodes with respect to the bottom electrode.

11 Claims, 5 Drawing Sheets

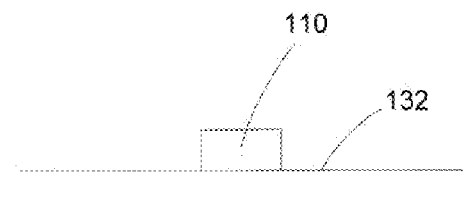
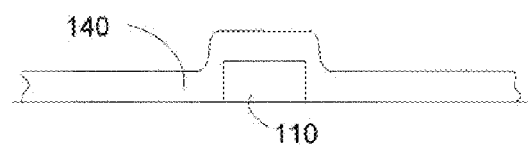
FIG. 4A
FIG. 4B
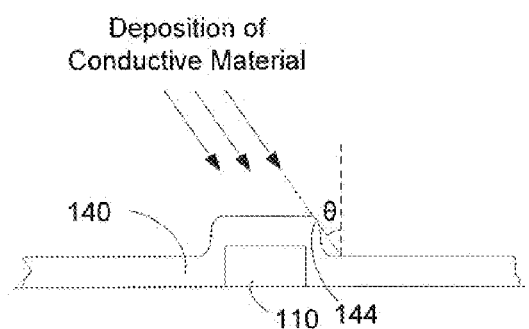
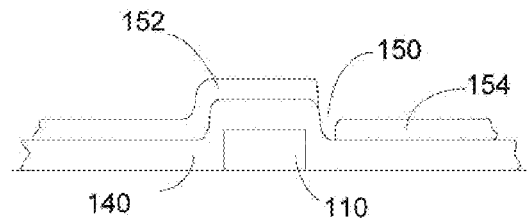
FIG. 4C
FIG. 4D
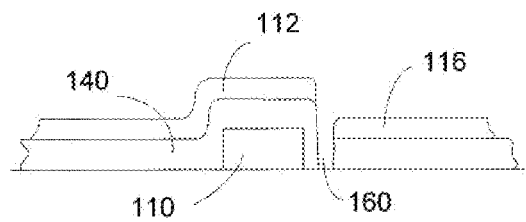
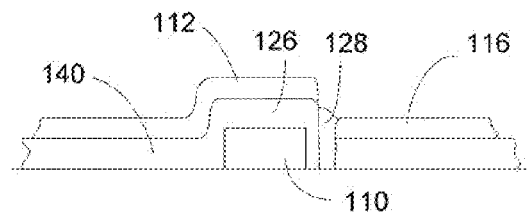
FIG. 4E
FIG. 4F

NANOSCALE THREE-TERMINAL SWITCHING DEVICE

BACKGROUND

In the past decades, the continuous trend in the development of electronic devices is to minimize the sizes of the devices. While the current generation of commercial microelectronics are based on sub-micron design rules, significant research and development efforts are directed towards exploring devices on the nanoscale, with the dimensions of the devices often measured in nanometers or tens of nanometers. Besides the significant reduction of individual device size and much higher packing density compared to microscale devices, nanoscale devices may also provide new functionalities due to physical phenomena on the nanoscale that are not observed on the microscale.

For instance, electronic switching in nanoscale devices using titanium oxide as the switching material has recently been reported. The resistive switching behavior of such a device has been linked to the memristor circuit element theory originally predicted in 1971 by L. O. Chua. The discovery of the memristive behavior in the nanoscale switch has generated significant interests, and there are substantial ongoing research efforts to further develop such nanoscale switches and to implement them in various applications.

The original nanoscale resistive switch utilizing titanium oxide as the switching material is a two-terminal device, with the switching material sandwiched between two electrodes that may be segments of two intersecting nanowires. When a relatively high switching voltage is applied to the two electrodes, the strong electrical field causes drifting of oxygen vacancies in the switching material. The redistribution of the oxygen vacancies in the switching material alters the resistance of the switching device. In this way, the device can be switched to ON or OFF states that correspond to high and low resistance values. The state of the switch can be determined later by applying a sensing voltage to the electrodes to sense the resistance of the device. The sensing voltage is much lower than the switching voltage required to cause ion drifting so that the state of the switch is not altered by sensing.

In the two-terminal nanoscale switching device, the two electrodes are used for both switching and sensing operations. For some applications, however, it may be desirable to have separate connections for device switching and sensing. For instance, in some applications, it may not be possible to both set the state of the switch and sense the device using one set of electronics. Moreover, the voltage and current requirements for setting the switch state may be much larger than those for state sensing, and better device control and greater design flexibility may be obtained by having separate connections for dedicated switching and sensing circuits. To that end, it has been proposed to use a three-terminal switching device that has a third electrode for the main purpose of applying the switching voltage to set the operational state of the device. Nevertheless, there has been no suitable design of such a nanoscale three-terminal switching device that can be fabricated in a practical way or allows integration of multiple three-terminal devices in an array such as in a nanowire crossbar design.

BRIEF DESCRIPTION OF THE DRAWINGS

Some embodiments of the invention are described, by way of example, with respect to the following figures. The components in the drawings are not necessarily to scale, and emphasis instead being placed upon clearly illustrating the principles of the present invention. Moreover, in the drawings, like reference numerals designate corresponding parts throughout the several views.

FIGS. 4A-4F are cross sectional views of layers formed on a substrate corresponding to the steps of the method for forming the three terminal device shown in FIG. 3.

DETAILED DESCRIPTION

Figure 1:
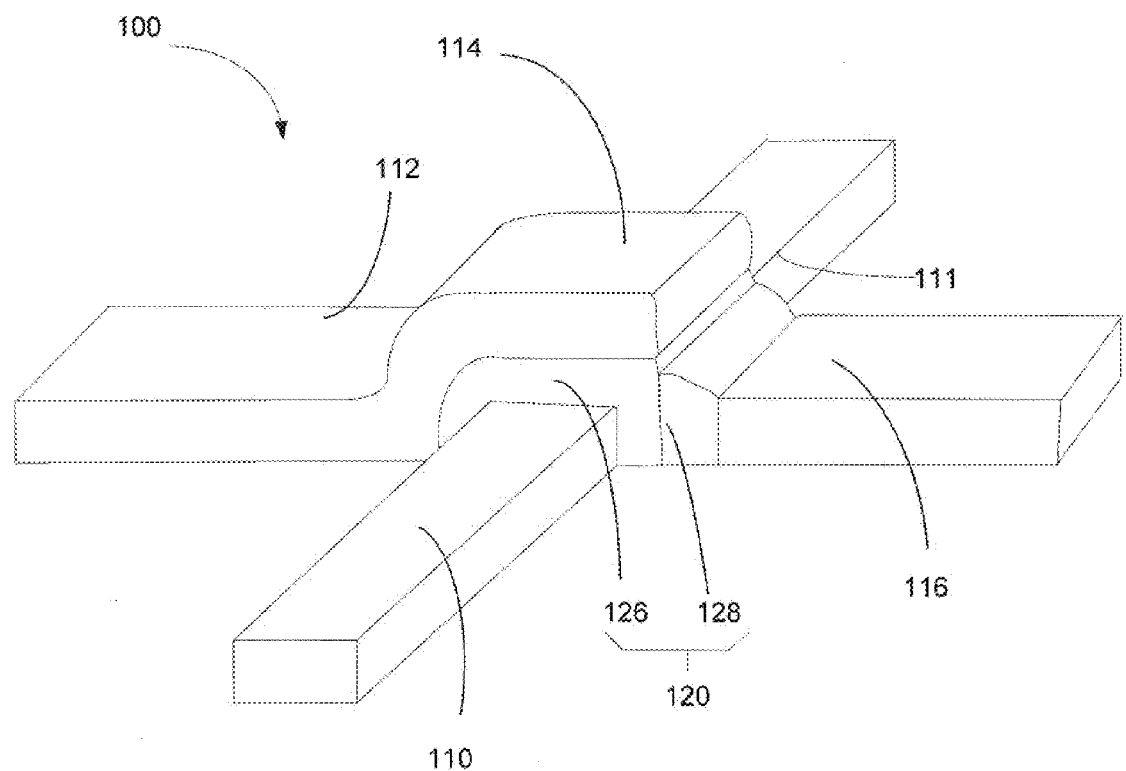
FIG. 1 is a schematic perspective view of a nanoscale three-terminal switching device in accordance with an embodiment of the present invention.

FIG. 1 shows a nanoscale three-terminal switching device 100 in accordance with an embodiment of the invention. The relatively simple construction of this device can be fabricated in a practical way using available nanoscale device fabrication techniques. Furthermore, a self-aligned fabrication process in accordance with an embodiment of the invention can significantly reduce the complexity and cost of fabricating circuitry incorporating the nanoscale switching device. This three-terminal switching device can be used as the building block for a crossbar array of nanoscale switching devices. As used herein, "nanoscale" means the device has one or more dimensions smaller than 1 micron, and often smaller than 100 nm. The small size of the switching device allows a plurality of the devices to be densely packed in arrays for various applications.

The three-terminal switching device 100 comprises a bottom electrode 110, a top electrode 112, a side electrode 116, and an active region 120 surrounded by and in electrical contact with the electrodes. Each of the top, bottom, and side electrodes may be a segment of a nanowire that has a width in the nanoscale. The width of the nanowires may be, for example, between 15 nm and 500 nm, and the thickness of the nanowires may be for example, from 5 nm to 500 nm. The top electrode 112 is disposed on one side of the bottom electrode 110, and extends in a direction that is at an angle with respect to the bottom electrode 110. The angle may be 90 degrees, i.e., the top electrode 112 is orthogonal to the bottom electrode 110, but may of a different value depending on the circuit design. The top electrode 112 has an end section 114 that goes over and overlaps the bottom electrode 110, and terminates generally along the edge 111 of the bottom electrode. This end section 114 is separated from the bottom electrode 110 by the active region 120. The side electrode 116 is disposed on the other side of bottom electrode 110 and generally opposite from the top electrode 112. The side electrode 116 is spaced apart from both the bottom electrode 110 and the end section 114 of the top electrode 112 by a small distance, such as 5-100 nm. In one embodiment described in greater detail below, the top electrode 112 and the side electrode 116 are both formed from a conductive material layer deposited in one single self-aligned deposition step.

Figure 2:
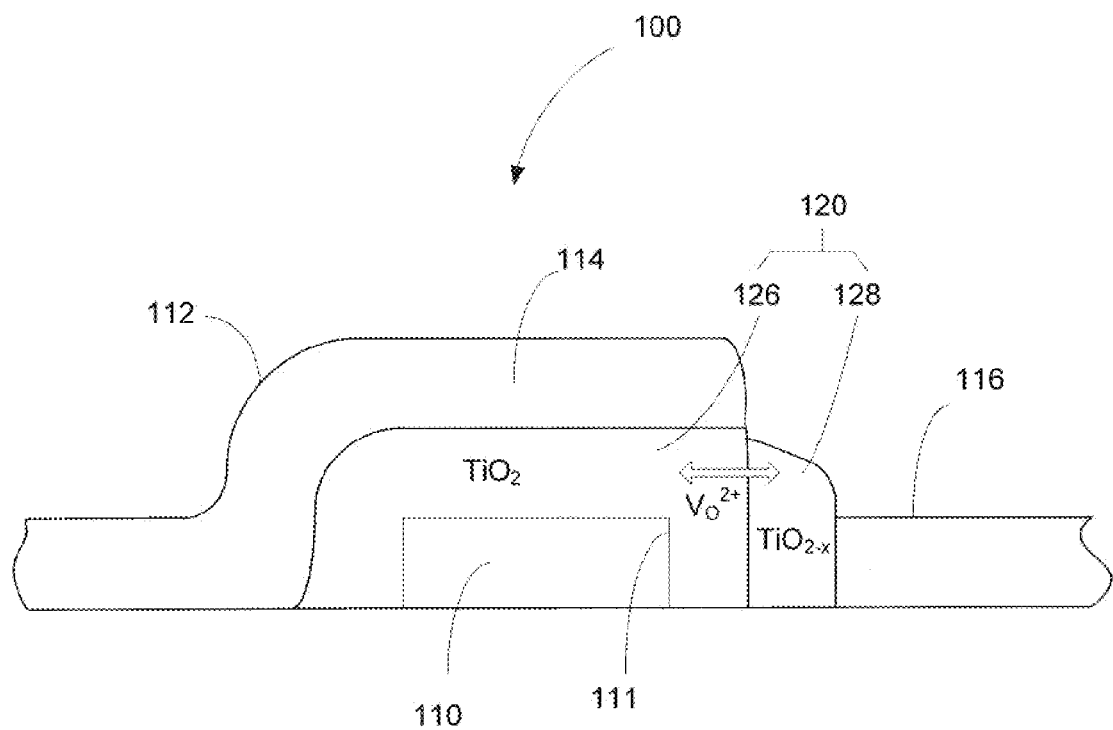
FIG. 2 is a cross-sectional view of the nanoscale three-terminal switching device shown in FIG. 1.

Turning now to FIG. 2, the portion of the active region 120 disposed between the top and bottom electrodes 110 and 112 is formed of a switching material. The switching material is capable of carrying a species of mobile dopants such that the dopants can be controllably transported into and/or through the switching material to change the electrical properties of either the switching material or the interface of the switching material and an electrode. This ability to change the electrical properties as a function of dopant distribution allows the switching device to be placed in different switching states by applying a switching voltage to the side electrode 116, as will be described in greater detail below.

Generally, the switching material may be electronically semiconducting or nominally insulating and a weak ionic conductor. Many different materials with their respective suitable dopants can be used as the switching material. Materials that exhibit suitable properties for switching include oxides, sulfides, selenides, nitrides, phosphides, arsenides, chlorides, and bromides of transition and rare earth metals. Suitable switching materials also include elemental semiconductors such as Si and Ge, and compound semiconductors such as III-V and II-VI compound semiconductors. The III-V semiconductors include, for instance, BN, BP, BSb, AlP, AlSb, GaAs, GaP, GaN, InN, InP, InAs, and InSb, and ternary and quaternary compounds. The II-VI compound semiconductors include, for instance, CdSe, CdS, CdTe, ZnSe, ZnS, ZnO, and ternary compounds. These listings of possible switching materials are not exhaustive and do not restrict the scope of the present invention.

The dopant species used to alter the electrical properties of the switching material depends on the particular type of switching material chosen, and may be cations, anions or vacancies, or impurities as electron donors or acceptors. For instance, in the case of transition metal oxides such as $TiO_2$, the dopant species may be oxygen vacancies. For GaN, the dopant species may be nitride vacancies or sulfide ions. For compound semiconductors, the dopants may be n-type or p-type impurities.

The side electrode 116 is in electrical contact with the active region 120, and may be used for applying an electrical field for causing the dopants to be transported and relocated in the active region between the top and bottom electrodes 110 and 112. In the embodiment of in FIG. 2, the active region 120 has two sub-regions; a primary active region 126 and a dopant source region 128. The primary active region is generally the region directly under the end section 114 of the top electrode 112 and around the bottom electrode 110, and the dopant source region 128 is between the primary active region 126 and the side electrode 116. The primary active region 126 contains the switching material, while the dopant source region 128 contains a dopant source material that functions as a source/sink of dopants, which can be driven into or out of the switching material in the primary active region 126 to alter the resistance of the switching device 100.

The nanoscale switching device 100 can be switched between ON and OFF states by controlling the concentration and distribution of dopants in the primary active region 126 between the top and bottom electrodes 110 and 112. When a DC switching voltage is applied to the side electrode with respect to the top and bottom electrodes, an electrical field is created across the dopant source region and the primary active region. This electric field, if of sufficient strength and proper polarity, may drive the dopants from the dopant source region 128 into the primary active region 126, and cause the dopants to drift through the switching material in the primary active region towards the top and/or bottom electrodes 110 and 112, thereby turning the device into an ON state. If the polarity of the electrical field is reversed, the dopants may drift in an opposite direction across the primary active region 126 and away from the top and bottom electrodes, thereby turning the device into an OFF state. In this way, the switching is reversible and may be repeated. Due to the relatively large electrical field needed to cause dopant drifting, after the switching voltage is removed, the locations of the dopants remain stable in the switching material. In other words, the switching may be non-volatile.

The state of the switching device may be read by applying a read voltage to the top and bottom electrodes 110 and 112 to sense the resistance across these two electrodes. The read voltage is typically much lower than the threshold voltage required to cause drifting of the ionic dopants between the top and bottom electrodes, so that the reading operation does not alter the ON/OFF state of the switching device.

By way of example, in the embodiment of FIG. 2, the active material in the primary active region 126 may be $TiO_2$ and the dopant source material in the dopant source region 128 may be $TiO_{2-x}$, where x is significantly smaller than 1. In this case, the mobile dopants are oxygen vacancies ($V_O^{2+}$). Initially, the $TiO_2$ in the primary active region 126 has a very low concentration of oxygen vacancies and may be nearly an insulator. The resistance of the switching device 100, as measured between the top and bottom electrodes 110 and 112, is relatively high. This may be the OFF state of the device. When a positive switching voltage is applied o the side electrode 116 with respect to either the bottom or top electrode, the electrical field causes the oxygen vacancies from the $TiO_{2-x}$ material in the dopant source region 128 to drift into the $TiO_2$ material in the primary active region 126 and to move towards the top and bottom electrodes. As the result of this injection of oxygen vacancies into the primary active region 126, the resistance of the device as measured between the top and bottom electrodes 110 and 112 may be significantly reduced and may be orders of magnitude smaller than that of the OFF state. In other words, the switching device is switched to the ON state.

To turn the device off, a negative switching voltage is applied to the side electrode 116. The electric field, which is opposite in direction to that of the switching-on operation, drives the oxygen vacancies away from the top and bottom electrodes 110 and 112, across the primary active region 126, and back into the dopant source region 128. As a result, the amount of oxygen vacancies in the $TiO_2$ switching material in the primary active region is reduced. With the reduction of the oxygen vacancy level in the switching material, the resistance between the top and bottom electrodes increases and may be returned to the level that defines the OFF state of the switching device.

The switching behavior described above may be based on different mechanisms. In one mechanism, the reduction of resistance may be a bulk property of the switching material in the primary active region 126. An increase of the dopant level in the switching material causes the resistance across the switching material to fall, and this may account for the decrease of the overall resistance of the device between the top and bottom electrodes. In another mechanism, the switching behavior may be an interface phenomenon. Initially, with a low dopant level in the switching material, the interface of the switching material and the top or bottom electrode may behave like a Schottky barrier, with a wider electrical barrier that is difficult for electrons to tunnel through. As a result, the device has a relatively high resistance. When dopants are injected into the switching material by applying a switching voltage to the side electrode 116, the dopants drift towards the top and bottom electrodes 110 and 112. The increased concentration of dopants at the electrode interface changes its electrical property from one like a Schottky barrier to one like an Ohmic contact, with a significantly reduced electrical barrier height or width. As a result, electrons can tunnel through the interface much more easily, and this may account for the significantly reduced overall resistance of the switching device. It is also possible that the resistance change is the result of a combination of both the bulk and interface mechanisms. Even though there may be different mechanisms for explaining the switching behavior, it should be noted that the present invention does not rely on or depend on any particular mechanism for validation, and the scope of the invention is not restricted by which switching mechanism is actually at work.

In the description above, the device is described to operate in a digital mode between ON and OFF for 0 and 1) states. The switching device, however, may also be operated as a multi-state device with three or more states or in an analogue mode. As described above, the resistance between the top and bottom electrodes across the active region 120 depends on the distribution of dopants in the switching material. By controlling the time and magnitude of the switching voltage applied to the side electrode 116, the concentration of dopants in the switching material can be finely adjusted. As a result, the resistance of the device may be continuously varied and can be set to different desired values.

It should also be noted that the inclusion of a dopant source region 128 in the three-terminal switching device is optional and is not required for the switching operation of the device. The switching device may still exhibit proper switching behavior even if the entire active region is made of the switching material. For example, in the embodiment of FIG. 2 the actively region may be entirely formed of $TiO_2$, without having a layer of $TiO_{2-x}$ between the side electrode and the top and bottom electrodes. The inclusion of a layer of dopant source material may have the benefits of better control over the device switching behavior and/or more reliable initial device activation, but is not strictly necessary for the three-terminal device to function as a switch.

Figure 3:
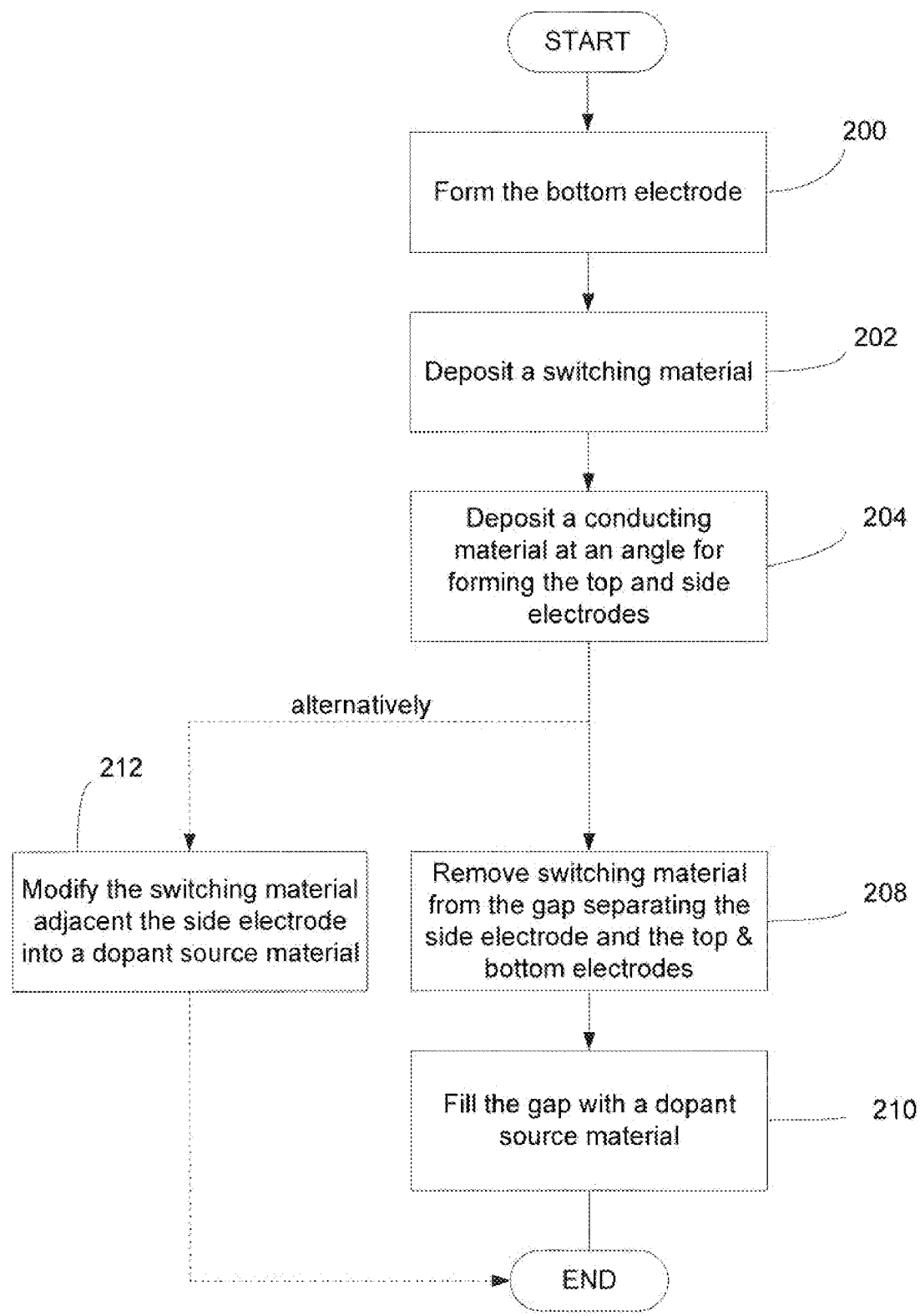
FIG. 3 is a flowchart showing a self-aligned fabrication method for making a nanoscale three-terminal switching device in accordance with an embodiment of the present invention.

In accordance with a feature of an embodiment of the invention, the three-terminal nanoscale switching device of FIGS. 1 and 2 can be fabricated using a process that utilizes a self-aligned deposition step to define the relative positions of the top and side electrodes 112 and 116 with respect to the bottom electrode 110. Due to the self-alignment, only one deposition step is required for forming both the top electrode 112 and the side electrode 116. This process is now described with reference to both the flowchart of FIG. 3 and the progression of the device stack structure shown in FIGS. 4A-4F.

To form the three-terminal device, the bottom electrode 110 is first formed on a substrate 132 (step 200). As mentioned earlier, the bottom electrode 110 may be a segment of a nanowire formed of a conductive material. The conductive material may be a metal, conductive oxide, conductive polymers, or any other material with suitable conductivity or physical properties. The nanowire may be formed by any suitable techniques of nanoscale device fabrication, which may include photolithography, nano-imprinting, laser-interference lithography, etc.

After the bottom electrode 110 is formed, a layer 140 of switching material is formed over the bottom electrode 110 (Step 202), as illustrated in FIG. 4B. This layer 140 may be formed, for instance, using physical vapor deposition, chemical vapor deposition, atomic layer deposition, etc. The deposition method may depend on the particular material to be formed and requirements of the characteristics of the deposited material. The switching material layer 140, which will become the active region of the switching device, may have a thickness of, for example, from 5 nm to 100 nm. In the embodiment illustrated in FIG. 4B, the switching material layer 140 is a blanket layer, i.e., it covers not only the bottom electrode 110 but also the remaining surface of the substrate 132. Nevertheless, the switching material layer may be formed, by using suitable patterning techniques, such that it covers only the top and sides of the bottom electrode.

After the layer 140 of switching material is formed over the bottom electrode, a conductive material is deposited onto the stack (step 204) for forming the top and side electrodes 112 and 116. This deposition step is a self-aligned operation in that the relative locations of the top electrode and the side electrode with respect to the bottom electrode are automatically defined without the need for any particular alignment operation. As shown in FIG. 4C, the conductive material is deposited onto the switching material layer 140 at an angle θ away from the surface normal. This deposition step puts down the conductive material for forming both the top electrode and the side electrode. Due to the incident angle of the deposition, a portion of the surface is shadowed by the edge or shoulder 144 of the switching material layer 140 deposited over the bottom electrode 110 in the previous step. As shown in FIG. 4D, due to this shadowing effect, a narrow strip 150 of void space running along the nanowire forming the bottom electrode 110 is not covered by the conductive material. This strip of void space or gap divides the deposited conductive layer into two halves right along the bottom electrode 110. The first portion 152 of the conductive material layer that forms the top electrode 112 is automatically terminated at the edge 144 of the switching material, while the second portion 154 that forms the side electrode 116 is spaced apart from the top electrode and the bottom electrode by a predefined distance, which depends on the height of the shoulder 144 and the deposition angle of the conductive material.

The two portions 152 and 154 of the conductive material layer as shown in FIG. 40 are formed into the top electrode 112 and the side electrode 116, respectively. This usually involves a lithography step, either before or after the deposition, to pattern the electrodes.

At this stage, the side electrode 116 is physically and electrically separated from the bottom and top electrodes by a thin layer of switching material. To form the embodiment of the device shown in FIGS. 1 and 2, the switching material in the space or gap 160 between the side electrode and the top and bottom electrodes is replaced with the dopant source material. To that end, the switching material in that space 160 is removed (step 208). This may be done, for example, by means of plasma etching to selectively remove the material from the gap 160. This step again utilizes self-alignment, because the top electrode 112 and the side electrode 116 are used as a mask to define the gap from which the switching material is to be removed. The resulting structure is shown in FIG. 4E. Thereafter, as shown in FIG. 4F, the space 160 is filled up by depositing the dopant source material onto the stack surface to form the dopant source region (step 210).

Alternative, the switching material adjacent the side electrode 116 can be modified to turn it into the dopant source material (step 212). The modification may be done by exposing the switching material to an ambient condition that alters the composition of the switching material. The ambient condition may be, for example, a gas that provides a desired species of dopants, or energized ions (i.e., ion implantation) of a selected element. For example, if the switching material is $TiO_2$, it can be turned into the dopant source material $TiO_{2-x}$ by implantation of Ti ions to increase the Ti/O ratio. Also, if the switching material is a semiconductor, the desired dopants can be added to the switching material by means ion implantation to form the dopant source material. This modification by means of exposure to an ambient condition is also self-aligned, as the top and side electrodes 112 and 116 may function as masks so that only the switching material between the top and side electrodes is exposed and modified into the dopant source material.

Figure 5:
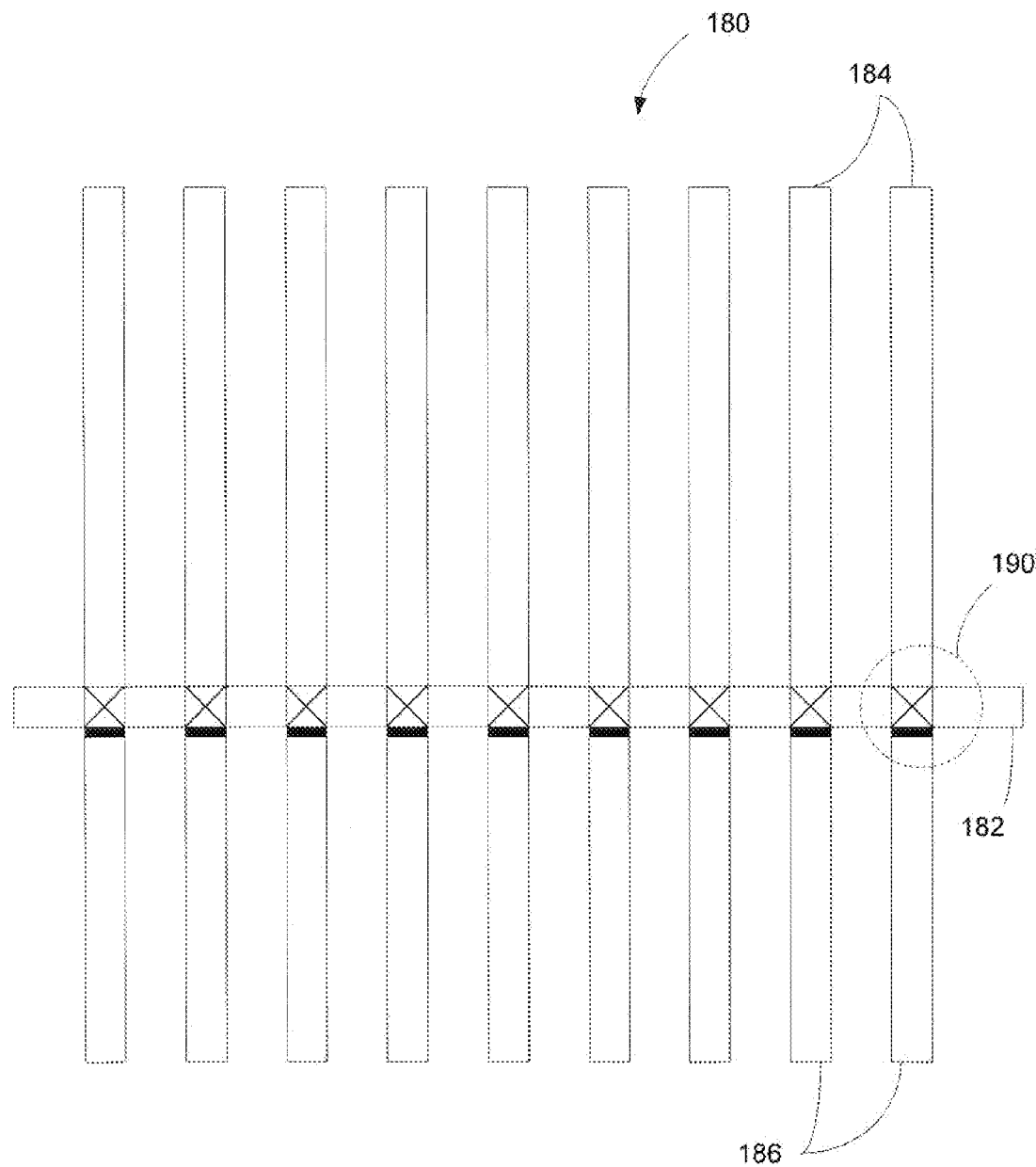
FIG. 5 is a top view of a crossbar array of nanoscale three-terminal switching devices in accordance with an embodiment of the present invention.

As mentioned above, the three-terminal nanoscale switching device can be used as the building block for constructing an array of such devices on a substrate. FIG. 5 shows such an array 180. The array includes a common bottom nanowire 182 that is shared by the switching devices 190 in the array as their respective bottom electrodes. The array 180 further includes a first set of generally parallel nanowires 184 that function as the top electrodes of the devices 190, and a second set of generally parallel nanowires 186 that function as the side electrodes of the devices. Each switching device 190 in the array 180 may have the structure shown in FIGS. 1 and 2. The entire array of switching devices may be fabricated on a substrate following generally the fabrication method shown in FIG. 3 and FIGS. 4A-4F.

The nanowires 182, 184 and 186 that form the bottom electrodes, top electrodes, and side electrodes of the switching devices can be connected to an external control circuit to enable operation of the switching devices. The electrical connections may be formed by means of for example, conductive routing traces on the substrate, vias, contact patches, etc. Each of the switching devices in the array can be individually addressed and operated for switching or sensing by selecting, through a suitable addressing architecture, the nanowires that form the bottom electrode, the top electrode, and the side electrode of the switching device.

Moreover, even though FIG. 5 shows only a one-dimensional array of the three-terminal devices, multiple arrays can be formed on the same substrate to form a two-dimensional matrix of such devices. Such a two-dimensional matrix may also be fabricated in one fabrication process, through proper patterning, following generally the steps of the method of FIG. 3. Each of the devices in the matrix may also be individually addressed and selected for operation.

In the foregoing description, numerous details are set forth to provide an understanding of the present invention. However, it will be understood by those skilled in the art that the present invention may be practiced without these details. While the invention has been disclosed with respect to a limited number of embodiments, those skilled in the art will appreciate numerous modifications and variations therefrom. It is intended that the appended claims cover such modifications and variations as fall within the true spirit and scope of the invention.

The invention claimed is:

1. A nanoscale three-terminal switching device comprising:
    a bottom electrode;
    a top electrode disposed on a first side of and extending at an angle with respect to the bottom electrode and having an end section going over and overlapping the bottom electrode;
    an active region disposed between and in electrical contact with the end section of the top electrode and the bottom electrode and comprising a switching material capable of carrying a species of dopants and transporting the dopants under an electrical field; and
    a side electrode disposed on a second side of the bottom electrode opposite from the top electrode and in electrical contact with the active region.

2. A nanoscale three-terminal switching device as in claim 1, wherein each of the bottom, top, and side electrodes is a nanowire.

3. A nanoscale three-terminal switching device as in claim 1, wherein the active region includes a primary active region and a dopant source region, the primary active region being disposed between the end section of the top electrode and the bottom electrode and containing the switching material, the dopant source region being disposed between the side electrode and the primary active region and formed of a dopant source material containing dopants that are capable of being driven by an electrical field to drift into the switching material in the primary active region.

4. A nanoscale three-terminal switching device as in claim 3, wherein the switching material is a metal oxide.

5. A nanoscale three-terminal switching device as in claim 4, wherein the switching material is $TiO_2$ and the dopants are oxygen vacancies.

6. A nanoscale three-terminal memristor device as in claim 1, wherein the switching material is a semiconductor.

7. A nanoscale crossbar array of three-terminal switching devices comprising:
    a first nanowire;
    a plurality of three-terminal switching devices formed on the first nanowire, each switching device comprising a segment of the first nanowire, a second nanowire on a first side of the first nanowire and extending at an angle with respect to the first nanowire and having an, end section going over and overlapping with the first nanowire, an active region disposed between the first nanowire and the end section of the second nanowire and comprising a switching material, and a third nanowire disposed on a second side of the first nanowire opposite from the second nanowire and in electrical contact with the active region, the switching material being capable of carrying a species of dopants and transporting the dopants under an electrical field.

8. A nanoscale crossbar array as in claim 7, wherein the active region of each three-terminal switching device comprises a primary active region and a dopant source region, the primary active region being disposed between the first nanowire and the end section of the second nanowire and containing the switching material, the dopant source region being disposed between the primary, active region and an end of the third nanowire and formed of a dopant source material containing dopants that are capable of being driven by an electrical field to drift into the switching material in the primary active region.

9. A nanoscale crossbar array as in claim 8, wherein the switching material is a metal oxide.

10. A nanoscale crossbar array as in claim 9, wherein the switching material is $TiO_2$ and the dopants are oxygen vacancies.

11. A nanoscale crossbar array as in claim 10, wherein the switching material is a semiconductor.

* * * * *

UNITED STATES PATENT AND TRADEMARK OFFICE
CERTIFICATE OF CORRECTION

PATENT NO. : 8,270,200 B2
APPLICATION NO. : 12/512230
DATED : September 18, 2012
INVENTOR(S) : Wei Wu et al.

It is certified that error appears in the above-identified patent and that said Letters Patent is hereby corrected as shown below:

In column 8, line 31, in Claim 7, delete "an," and insert -- an --, therefor.

In column 8, line 47, in Claim 8, delete "primary," and insert -- primary --, therefor.

Signed and Sealed this
Second Day of April, 2013

Teresa Stanek Rea
*Acting Director of the United States Patent and Trademark Office*